United States Patent
Boyd (12)

(10) Patent No.: US 6,350,949 B1
(45) Date of Patent: Feb. 26, 2002

(54) SEALED POWER DISTRIBUTION MODULE

(75) Inventor: Kenneth Stokes Boyd, Yadkinville, NC (US)

(73) Assignee: Tyco Electronics Corp, Wilmington, DE (US)

( * ) Notice: Subject to any disclaimer, the term of this patent is extended or adjusted under 35 U.S.C. 154(b) by 0 days.

(21) Appl. No.: 09/602,309

(22) Filed: Jun. 23, 2000

(51) Int. Cl.[7] ................................................. H05K 5/06
(52) U.S. Cl. ..................... 174/50.5; 174/17.05; 174/50; 220/3.8
(58) Field of Search ............................. 174/50.5, 17.05, 174/68.3, 76.2, 87, 254, 133 B, 17 VA, 50, 50.51, 52, 50.52, 50.53, 68.2, 250, 252, 71 B, 72 B, 77 R, 48, 52.3, 57, 65 R; 220/3.2–3.8; 439/76.2, 131, 501; 277/628, 910, 920, 311

(56) References Cited

U.S. PATENT DOCUMENTS

| | | | |
|---|---|---|---|
| 5,059,748 A | * 10/1991 | Allen et al. ................... 174/87 |
| 5,541,363 A | * 7/1996 | Weise et al. .................. 174/50 |
| 5,670,745 A | * 9/1997 | Yajima et al. ............. 174/65 R |
| 5,779,244 A | * 7/1998 | Moriarty et al. ............ 277/311 |
| 5,942,728 A | * 8/1999 | Chen ........................ 174/65 R |
| 5,995,380 A | * 11/1999 | Maue et al. ................. 174/254 |
| 6,000,952 A | * 12/1999 | Gladd et al. ................ 439/76.2 |
| 6,078,501 A | * 6/2000 | Catrambone et al. ......... 174/50 |
| 6,097,596 A | * 8/2000 | Cipolla et al. .......... 174/17 VA |
| 6,116,916 A | 9/2000 | Kasai ........................ 439/76.2 |

OTHER PUBLICATIONS

RAYCHEM, GelTEk Connector Sealant Pads, Electrical contact and wire seals, Dated. Copyright 1996.
W. L. Gore & Associates—Membrane Filtration & Seperation—Automotive Venting Prod., Membrane Filtration & Separations, Dated, p. 1 of 2 and p. 2 of 2. Copyright 1998.

* cited by examiner

*Primary Examiner*—Dean A. Reichard
*Assistant Examiner*—Angel R. Estrada (57) ABSTRACT

An environmentally sealed power distribution module is disclosed having a hybrid peripheral seal disposed around a power distribution panel and within an interface between a top housing and a base housing. The peripheral seal is comprised of a traditional o-ring type seal having an open segment and a gel pad type seal located within the open segment, thereby completing the peripheral seal. Plate-like power distribution bus bars are reliably sealed by the gel pad type seal as the bus bars exit the power distribution module. A sealed releasable cover is provided to access fuses and other electrical components of the power distribution module.

20 Claims, 11 Drawing Sheets

SEALED POWER DISTRIBUTION MODULE

FIELD OF THE INVENTION

The present invention is directed to sealed power distribution modules. The invention is particularly applicable to environmentally sealed power distribution modules for use in automotive applications.

BACKGROUND OF THE INVENTION

Power distribution modules, or central electric boxes, are commonly used in automotive applications to distribute power throughout an automobile. Often, circuitry is disposed on a printed circuit board which includes electrical components and tab and receptacle contacts for connection to wiring harnesses, fuses, relays and engine control units. The printed circuit board is typically disposed in a housing with a cover secured over the electrical components and terminals. The entire power distribution module is then mounted in an accessible region of the automobile, often along the bulkhead of the passenger compartment, to allow for replacement of fuses and other components and for easy performance of diagnostic tests.

Since most power distribution modules are located in the passenger compartment of an automobile, sealing the module from the environment has not been a necessity. Even for applications where a power distribution module is placed within the engine compartment of an automobile, typically only a basic cover is needed to safeguard against dirt and occasional splashing of liquids against the module. However, some more rigorous automotive applications demand reliable sealing of the power distribution module when the module is located in the engine compartment of the automobile. Such applications are dictated when continuous exposure to environmental elements is expected or if, for example, the automobile is expected to be subjected to high pressure under-carriage cleaning processes. Such is the case with many corporate fleet automobiles and commercial trucking lines.

Unfortunately, environmentally sealed housings do not present a friendly atmosphere for printed circuit boards carrying electronic components and power distribution circuitry. A sealed housing typically retains heat which leads to pressure and temperature differentials between the interior and exterior of the housing and also presents the potential for accumulation of condensation within the sealed housing. Power distribution modules generate relatively high temperatures due to the large currents being carried by the circuitry in the modules and the presence of electrical components which produce heat. The temperature and pressure differentials stress the circuit board and may cause damage to the power distribution module. Accordingly, power distribution modules have an increased sensitivity to sealed environments because of the rapid temperature increases within the housing.

Another complication presented by sealed power distribution modules is the need to supply and distribute power from terminals which must pass from the exterior of the module to the interior of the housing, through the electronic circuitry, and back out to the exterior of the module. These power distribution terminals, therefore, must pass through the sealed housing, thereby potentially compromising the sealing integrity of the module. This potential is dramatically increased when the power distribution terminals take the form of bus bars which are flat plate-like terminals. Flat bus bars are desirable because of their effectiveness in reducing power dissipation. However, these bus bars are difficult to seal using traditional O-ring seals because the O-ring tends not to seal at edges of the bus bar but, rather, creates an "eyeing" effect which does not completely seal all surfaces of the bus bar.

Accordingly, a power distribution module is needed which provides power distribution bus bars with reduced power dissipation and reliable environmental sealing to resist ingress of liquids and other contaminants while minimizing the negative effects caused by the levels of heat associated with power distribution modules.

SUMMARY OF THE INVENTION

An environmentally sealed power distribution module is provided having a power distribution panel captured between a base housing and a top housing. The power distribution panel has bus bars which project from the base housing and the top housing. An o-ring type seal is disposed along a common perimeter between the base housing and the top housing and a gel type seal is disposed around the bus bars.

In an alternative embodiment, an environmentally sealed electronic module is provided having a circuit board disposed between a base housing and a top housing. The base housing and the top housing define an interface about a perimeter around the circuit board. Bus bars extend from the circuit board and project through the interface. An o-ring type seal is disposed within the interface and a gel type seal is disposed within the interface and around the bus bars.

In another alternative embodiment, an environmentally sealed module is provided having a base housing and a top housing attached at an interface. An electronic module is disposed between the base housing and the top housing. An o-ring type seal is disposed around the electronic module within the interface and has an open segment between free ends of the o-ring type seal. A gel type seal is disposed within the interface in the open segment and at least one terminal of the electronic module passes through the gel type seal.

In yet another embodiment of the invention, a hybrid peripheral seal is provided for sealing an interface. The hybrid peripheral seal comprises an o-ring type seal having an open segment between two free ends and a gel type seal disposed in the open segment.

BRIEF DESCRIPTION OF THE DRAWINGS

Embodiments of the invention will now be described by way of example with reference to the following drawings, in which.

DETAILED DESCRIPTION OF THE INVENTION

Figure 1:
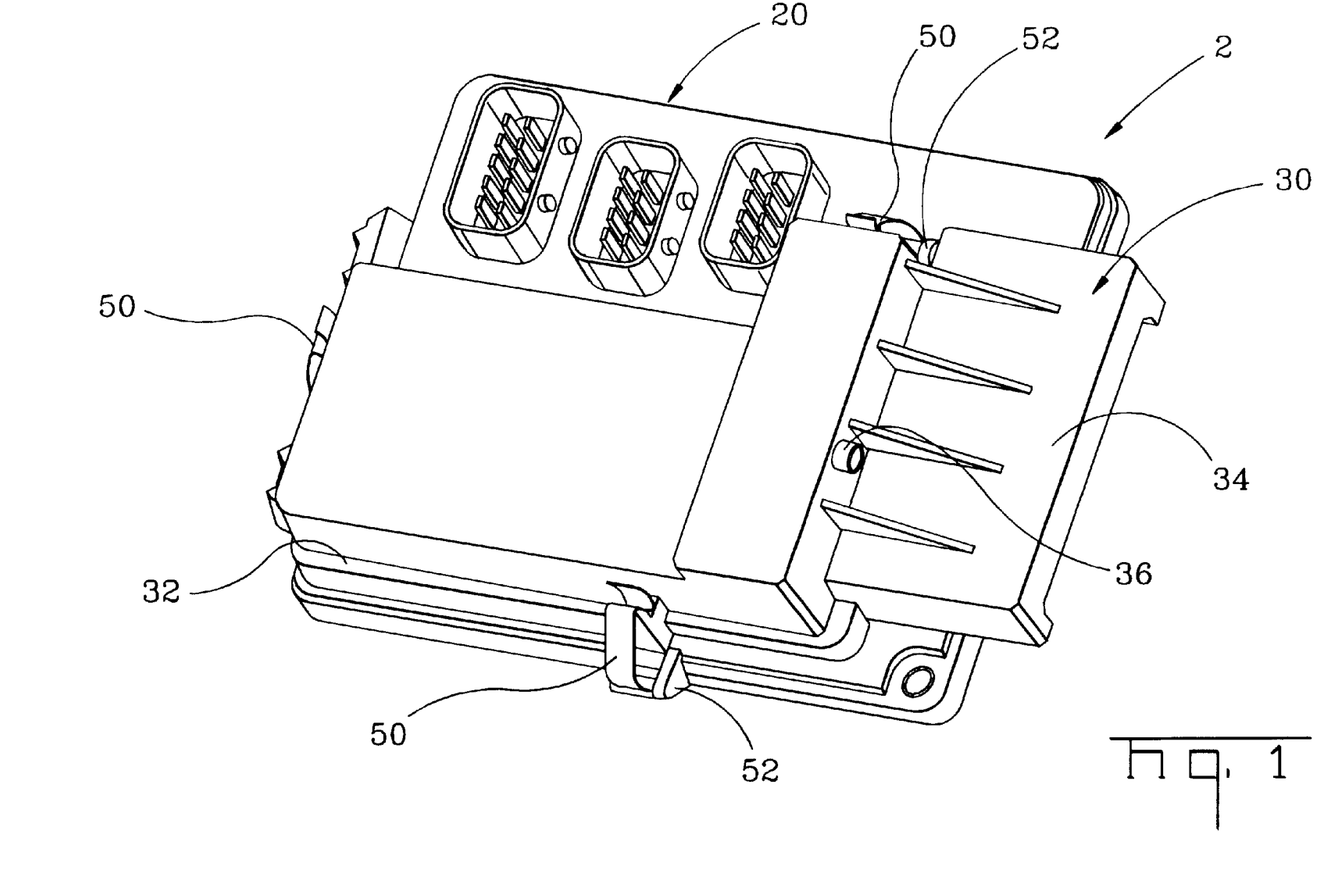
FIG. 1 is an isometric view of a power distribution module in accordance with the present invention.
Figure 2:
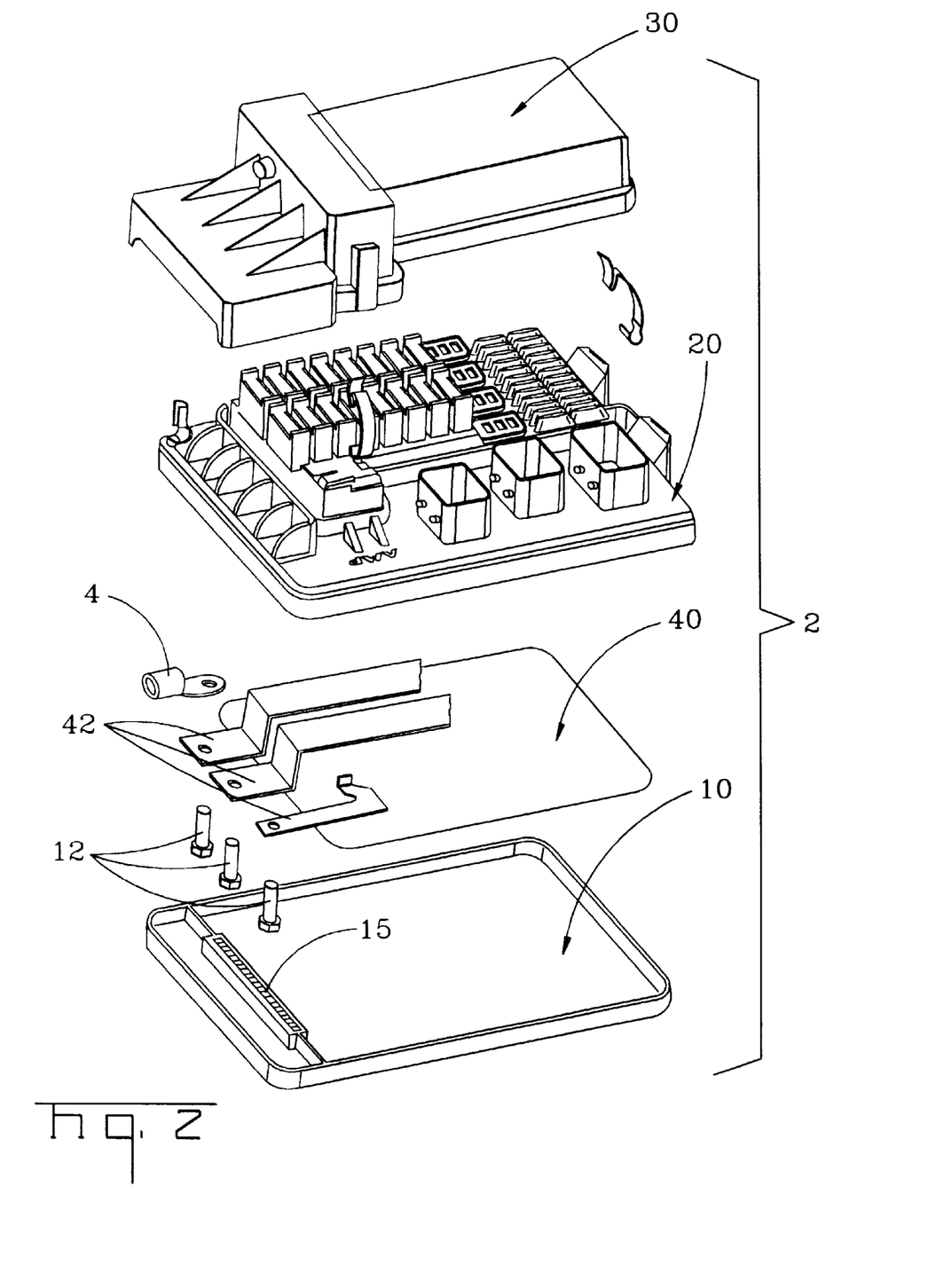
FIG. 2 is an exploded isometric view of an embodiment of the power distribution module of the present invention.

FIGS. 1 and 2 show a power distribution module 2 in accordance with the present invention. Power distribution module 2 comprises a base housing 10, a top housing 20 and a cover 30 which cooperate to house a power distribution panel 40. In order to protect power distribution panel 40, each interface between base housing 10, top housing 20 and cover 30 must be environmentally sealed to prevent ingress of fluids and other contaminants.

Figure 3:
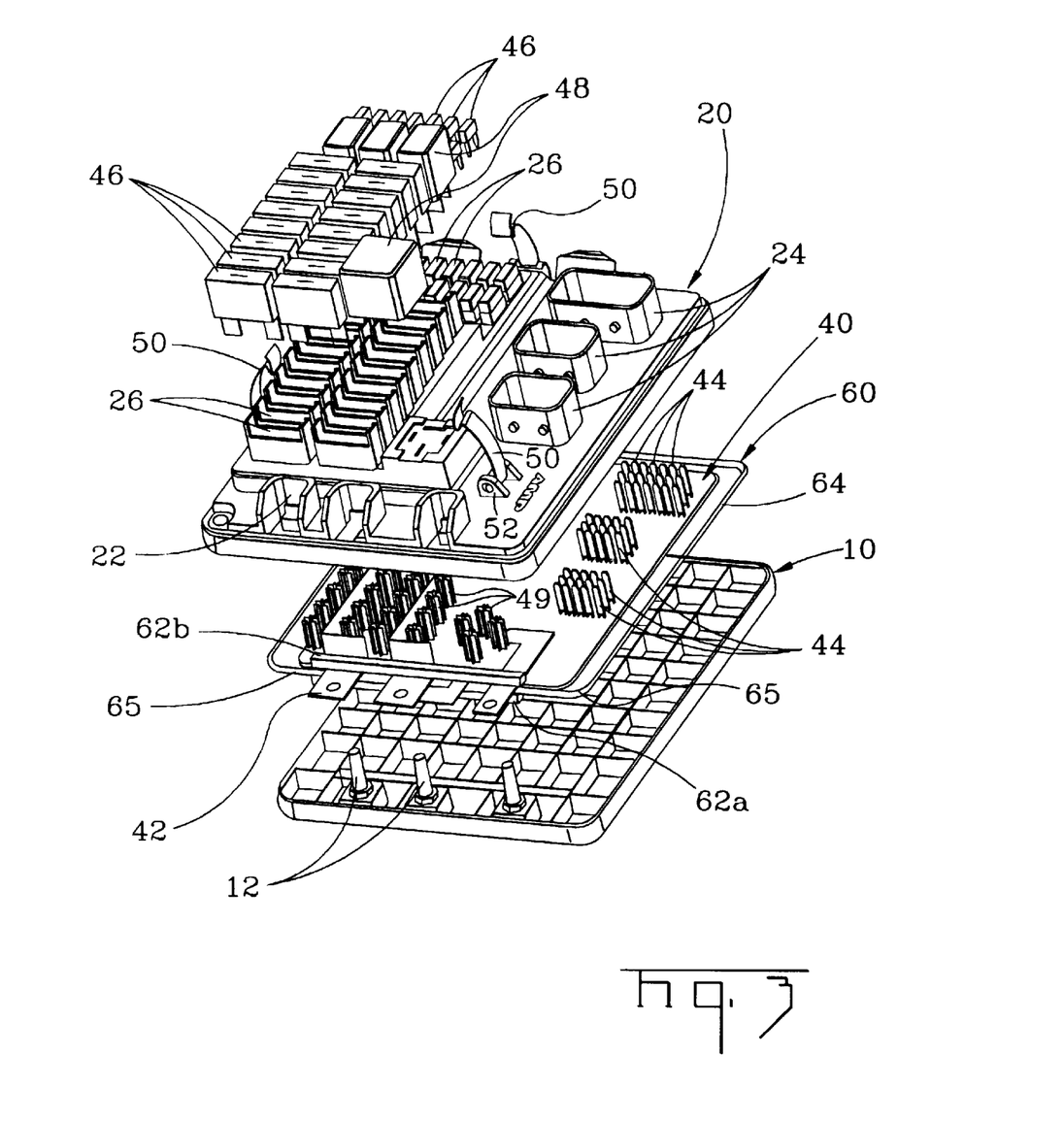
FIG. 3 is an exploded isometric view of a second embodiment of the power distribution module of the present invention, shown without a cover.
Figure 4:
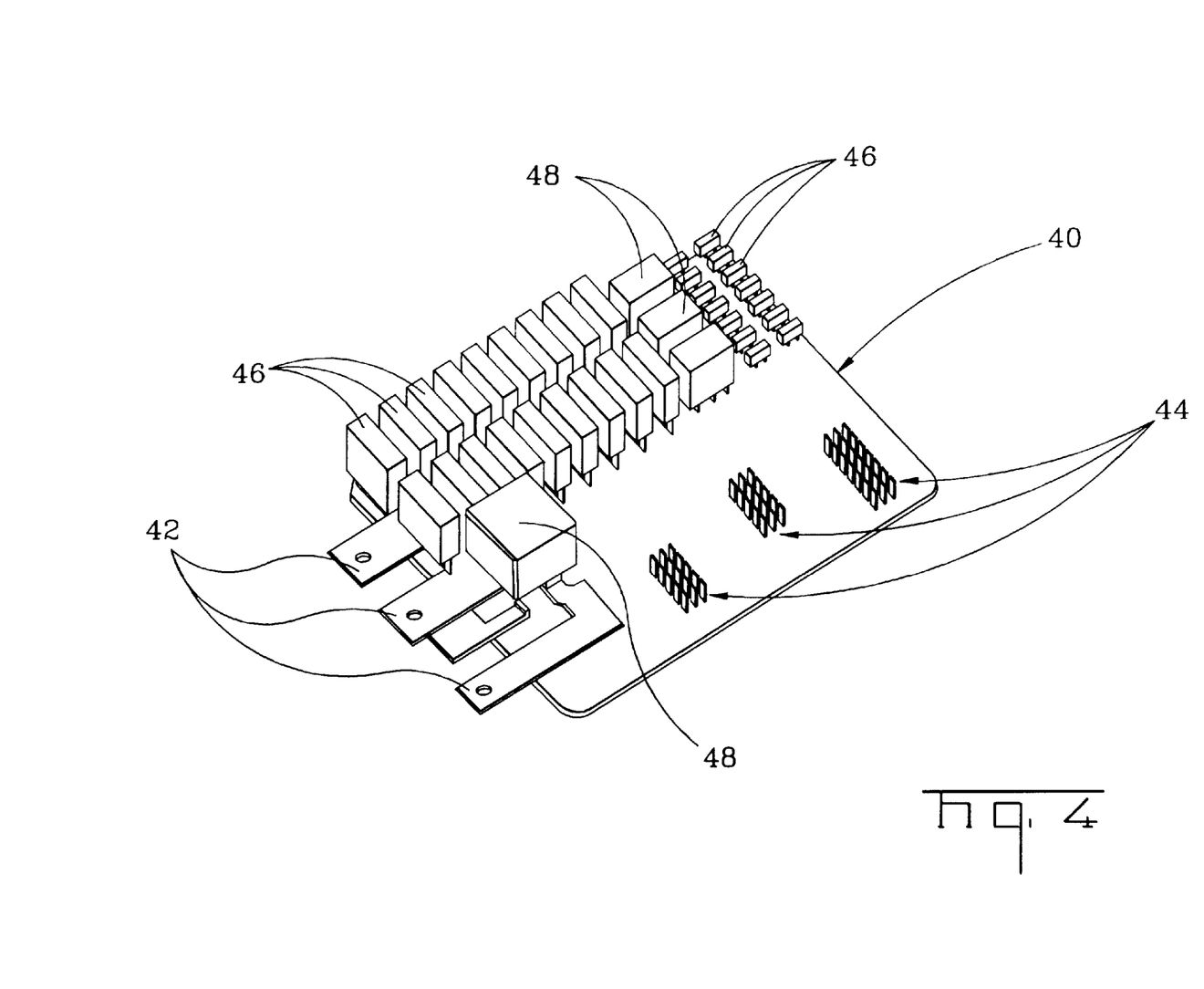
FIG. 4 is an isometric view of an embodiment of a power distribution panel used with the power distribution module of the present invention.

As shown in FIG. 2, power distribution panel 40 is shown merely having power distribution bus bars 42 disposed on panel 40. Power distribution panel 40 may have numerous electrical components and circuitry interconnecting such components. FIGS. 3 and 4 show a more specific embodiment of the present invention in which power distribution panel 40 takes the form of a printed circuit board comprising tab type electrical contacts 44, and multiple fuses 46 and relays 48 connected to power distribution panel 40 by way of receptacle contacts 49. Power is provided to and from power distribution panel 40 via power distribution bus bars 42. Lugs 12 are provided on base housing 10 to cooperate with bus bars 42 and provide points for attachment of power distribution cabling (not shown) via terminals 4.

Figure 5:
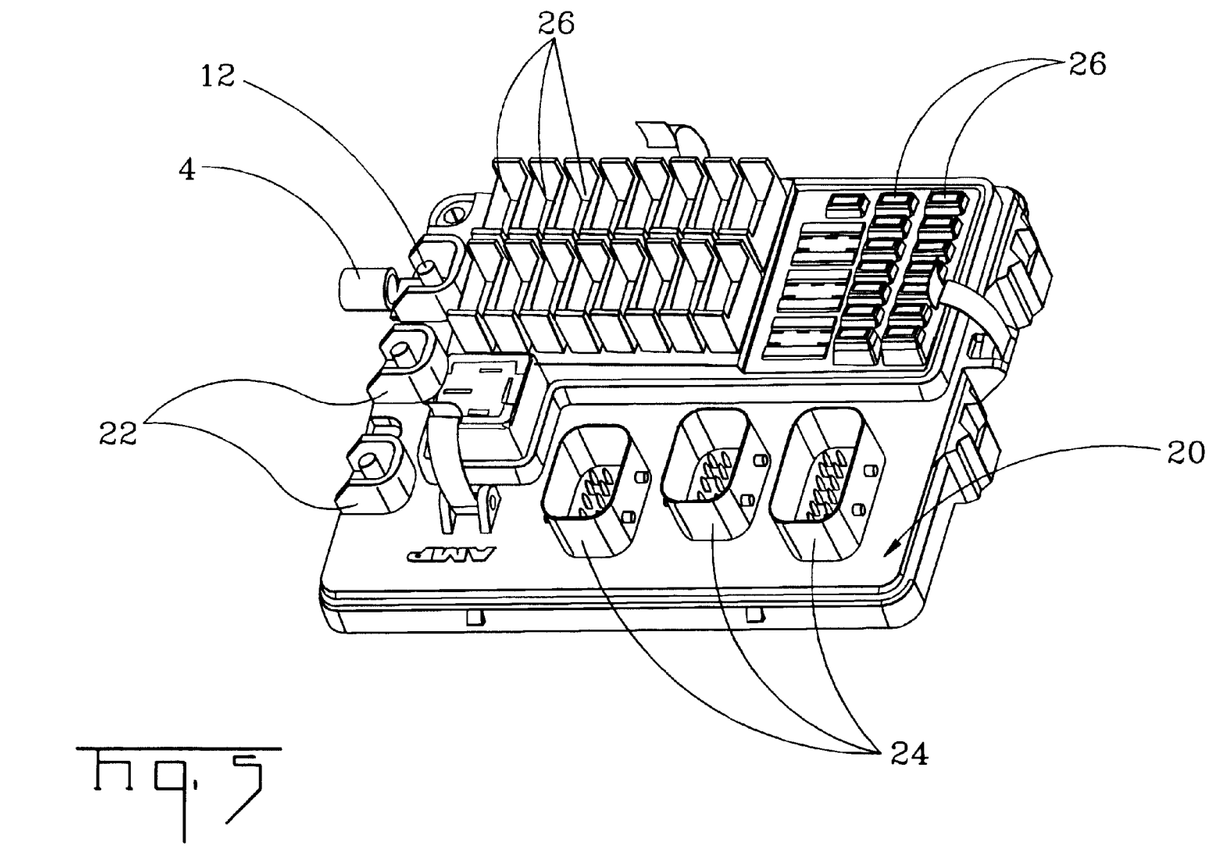
FIG. 5 is an isometric view of a top housing assembled to a base housing in accordance with the present invention.

FIG. 5 shows top housing 20 attached to base housing 10 with power distribution panel 40 captivated therebetween. Referring to FIGS. 3 and 5, top housing 20 provides multiple shrouds 24 which surround tab type electrical contacts 44 and which are designed to receive sealed electrical connectors (not shown) which are connected to portions of a vehicle's wiring harness. Fuses 46 become disposed in walled cavities 26 which provide relative alignment and guiding surfaces for inserting fuses 46 into receptacle contacts 49. Flanges 22 are located on top housing 20 and partially surround lugs 12.

Figure 6:
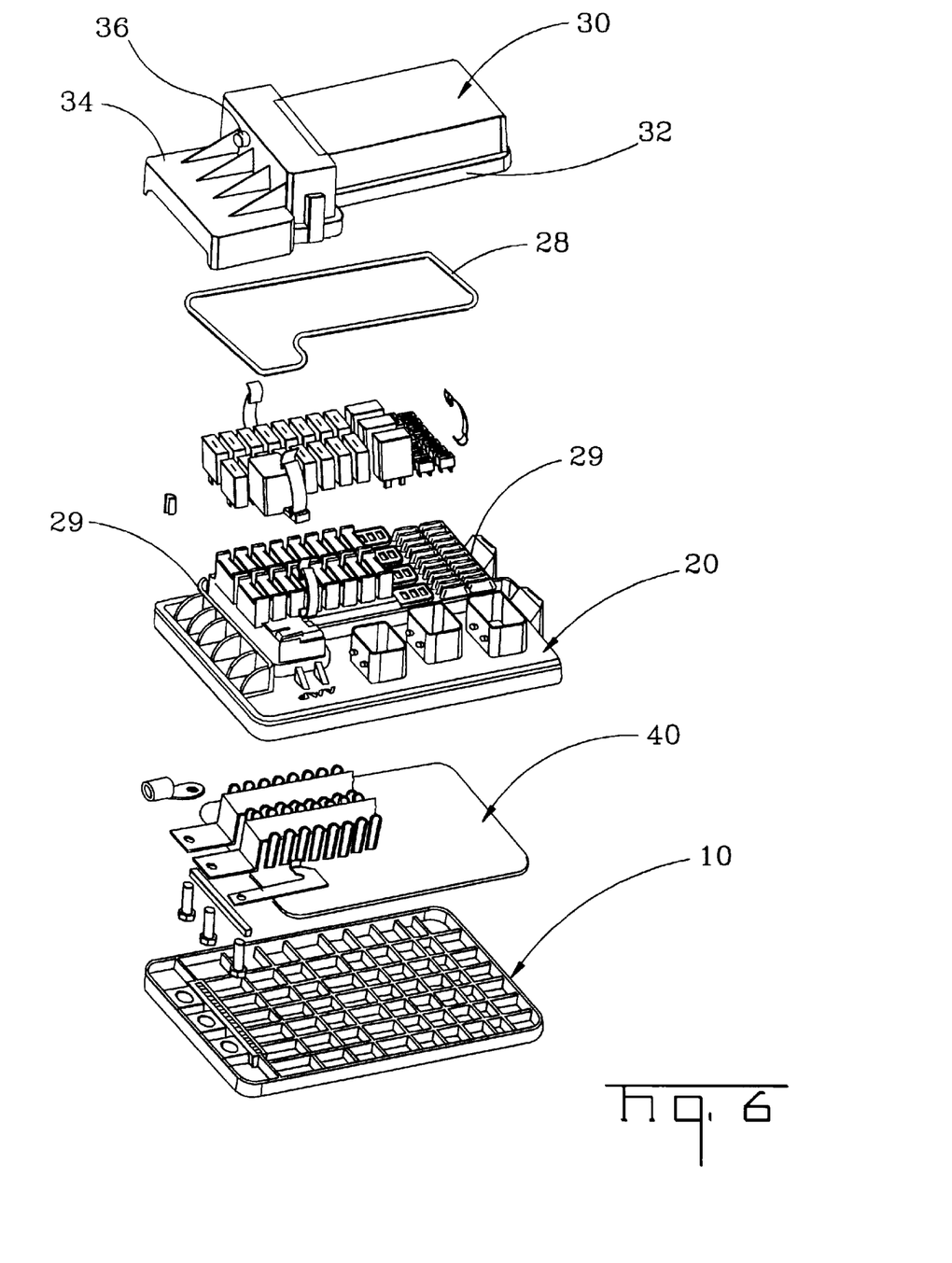
FIG. 6 is an exploded isometric view of the power distribution module of FIG. 3, shown with a cover.

Because wiring harnesses that mate with shrouds 24 and tab type electrical contacts 44 are routed to other portions of the vehicle, these areas are exposed on top housing 20 for connection to sealed electrical connectors (not shown). However, as shown in FIG. 6, the portion of top housing 20 which contains walled cavities 26 for fuses 46 receives a cover 30 having a seal 28 disposed within a groove in flange 32. The sealed flange 32 of cover 30 surrounds the area of top housing 20 having walled cavities 26 and fuses 46. Sealed flange 32 engages rim 29 thereby providing a sealing interface between cover 30 and top housing 20. A hood 34 is also provided on cover 30 and extends over flanges 22 of top housing 20 and bus bars 42, lugs 12 and terminals 4. Hood 34 thereby provides protection from occasional splashing which occurs in a vehicle engine compartment, however, this hood 34 does not provide fail-proof sealing to those areas of the power distribution module located under hood 34.

Figure 7:
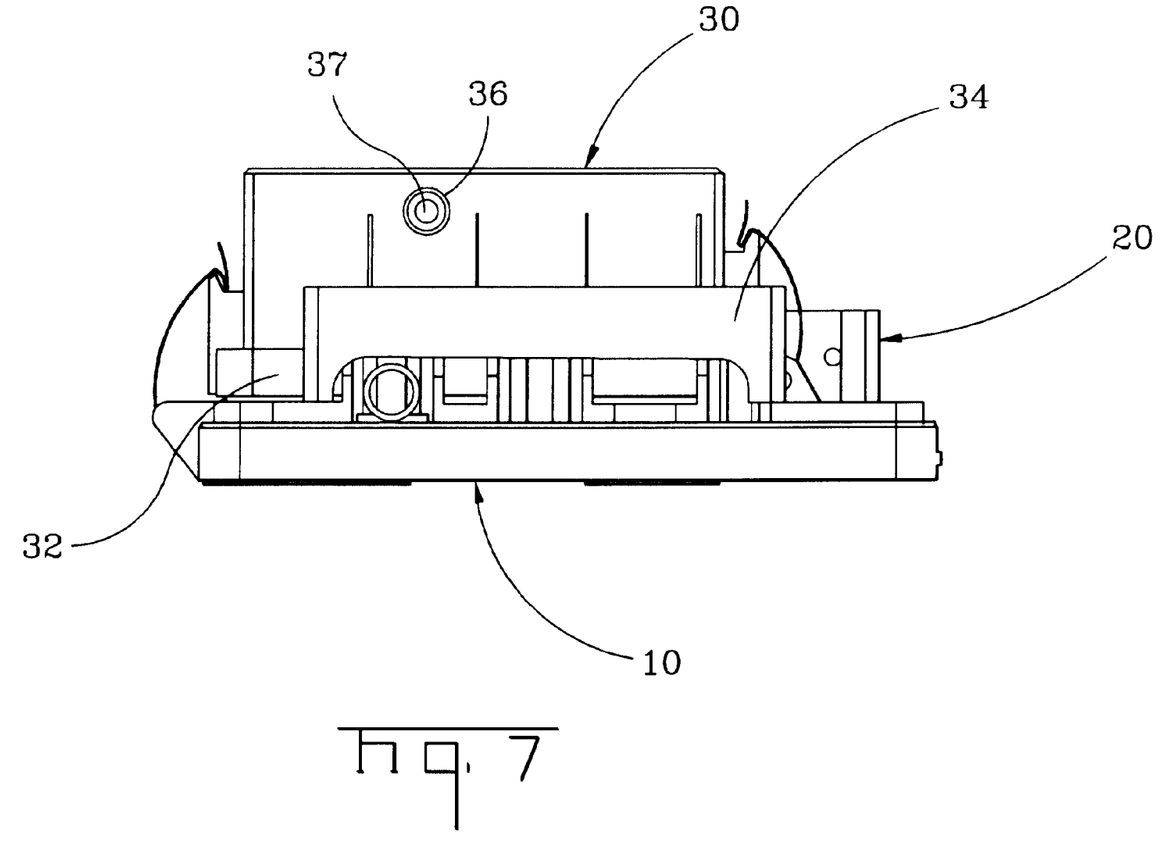
FIG. 7 is a side view of a power distribution module of the present invention.

As shown in FIG. 7, a vent 36 is also provided on cover 30 to prevent ingress of fluids and other contaminants into the sealed portion of cover 30 and top housing 20. This vent 36 may be constructed of commercially available venting membranes 37, such as W. L. Gore's OLEOGARD® Vents, which inhibit penetration of fluids and contaminants in one direction while allowing for escape of vapor and pressure in another direction. That is, gases under pressure within cover 30 would be permitted to escape through vent 36, along with vapor which otherwise may manifest itself in the interior of the cover in the form of condensation.

Cover 30 is removably secured by way of clasps 50 which are attached to hinges 52 on top housing 20. Of course, other means of latching cover 30 to top housing 20 could easily be incorporated, such as molding cooperating shoulders on flange 32 and rim 29.

Figure 8:
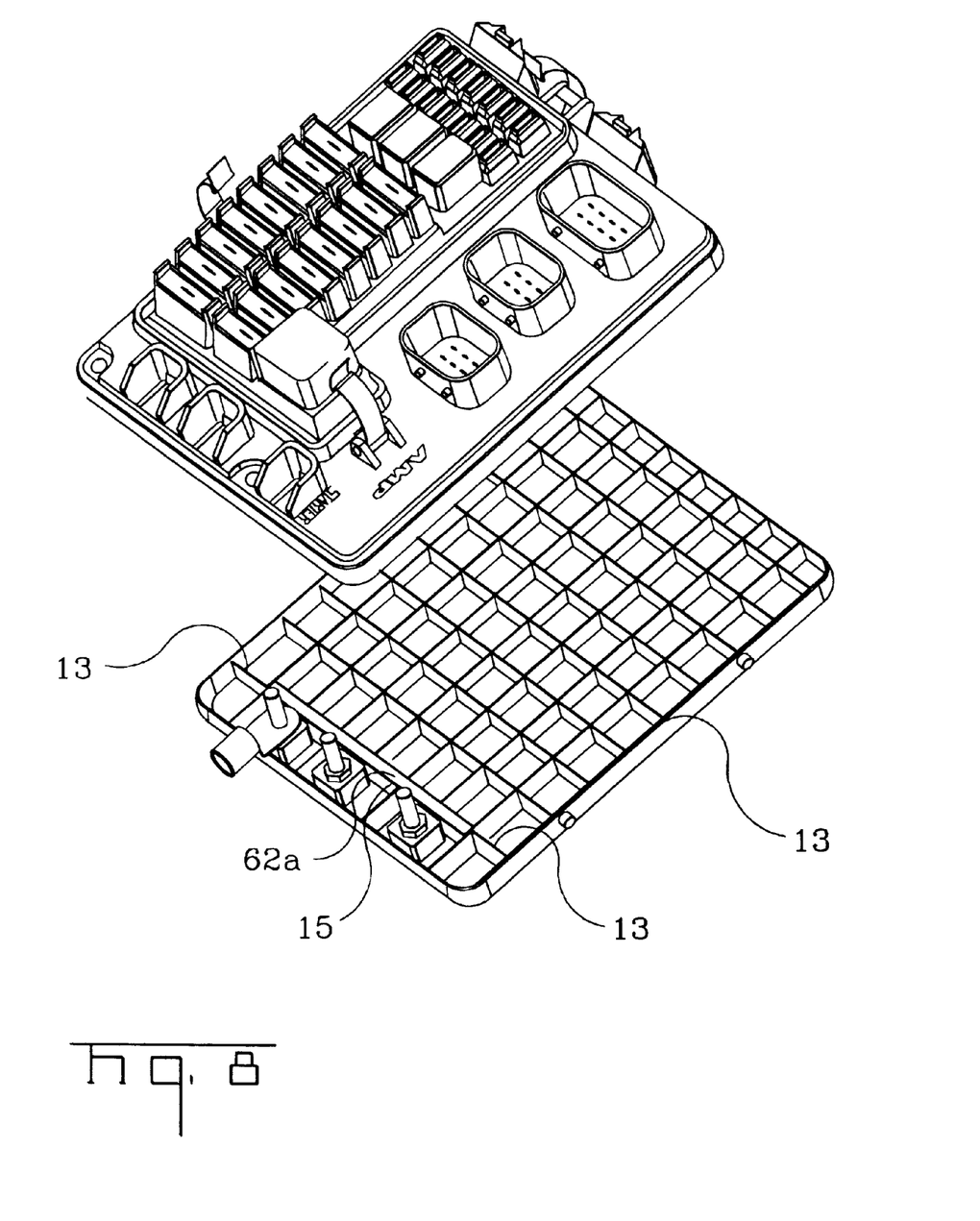
FIG. 8 is an exploded isometric view of a top housing and a base housing of the present invention.
Figure 9:
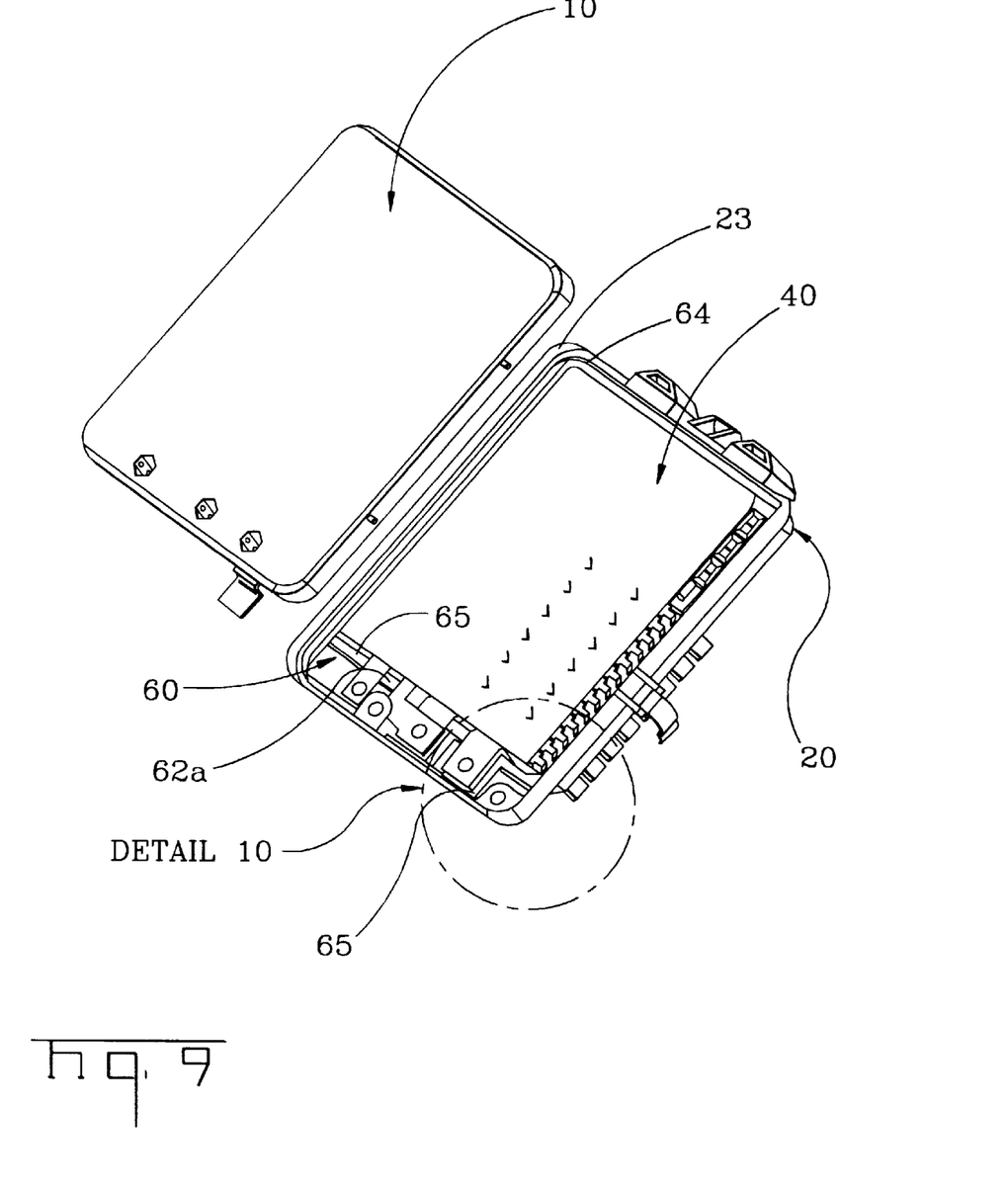
FIG. 9 is an exploded bottom isometric view of the top housing and the bottom housing shown in FIG. 8.
Figure 10:
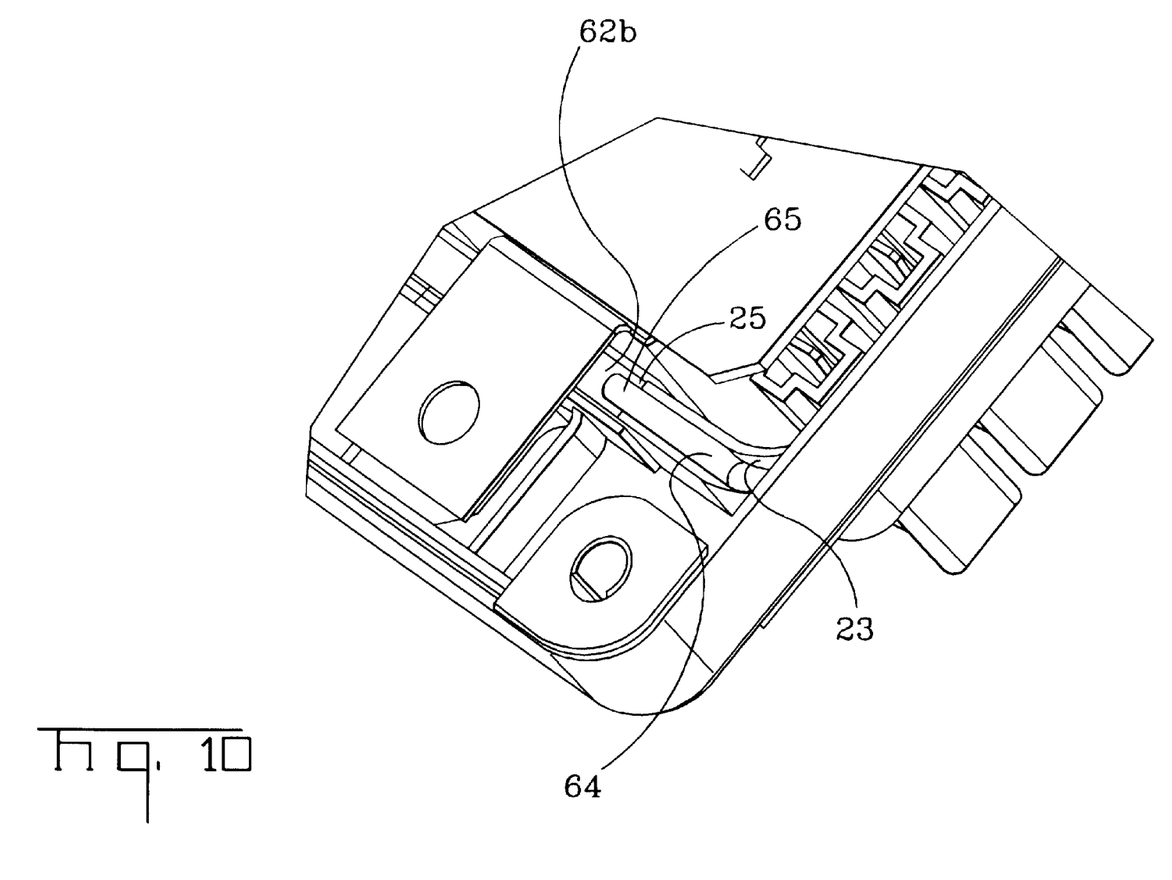
FIG. 10 is a detail view of the detail area circled in FIG. 9.

Referring to FIGS. 8 through 10, a sealing interface is also provided between base housing 10 and top housing 20 in order to provide protection of the power distribution panel 40 disposed within the inside of a peripheral seal 60. Peripheral seal 60 is comprised of bottom and top gel pad layers 62a and 62b which cooperate with O-ring type seal 64 to provide a hybrid peripheral seal, or gasket, between base housing 10 and top housing 20. O-ring type seal 64 is disposed in a peripheral groove 23 which corresponds with a peripheral rib 13 on base housing 10. O-ring type seal 64 has free ends 65 which have an open segment therebetween. This open segment is completed by bottom and top gel pads 62a and 62b which are received in sealing cavities 15 and 25, respectively. Free ends 65 of O-ring type seal 64 extend into end portions of sealing cavity 25 and directly contact top gel pad 62b.

Power distribution panel 40 is disposed within peripheral seal 60 such that power distribution bus bars 42 cross through peripheral seal 60 at the open segment of O-ring type seal 64 which is filled with bottom and top gel pads 62a and 62b. Therefore, upon assembly of base housing 10, power distribution panel 40 and top housing 20, a sealing interface is establish between base housing 10 and top housing 20 and the integrity of this sealing interface is maintained even at power distribution bus bars 42 since bus bars 42 become sealed between bottom and top gel pads 62a and 62b. This is because bottom and top gel pads 62a and 62b are comprised of a gel-like material, such as commercially available Raychem GelTek® Connector Sealant Pads, which are conformable sealing materials which tightly conform to the shape of bus bars 42 and free ends 65 of O-ring type seal 64. As shown in FIG. 2, walls of sealing cavities 15 and 25 may be scalloped to accommodate passage of bus bars 42 therethrough. Bottom and top gel pads 62a and 62b will flow around bus bars 42 to seal around bus bars 42 and around scalloped portions of walls of walled cavities 15 and 25.

Figure 11A:
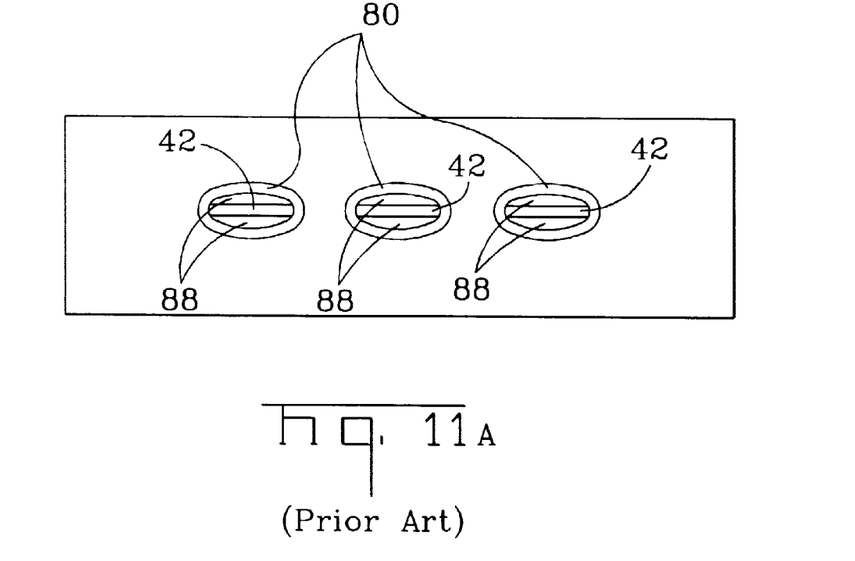
FIGS. 11a and 11b are diagramatical representations of prior art sealing techniques applied to power distribution bus bars used in the power distribution module of the present invention.
Figure 11B:
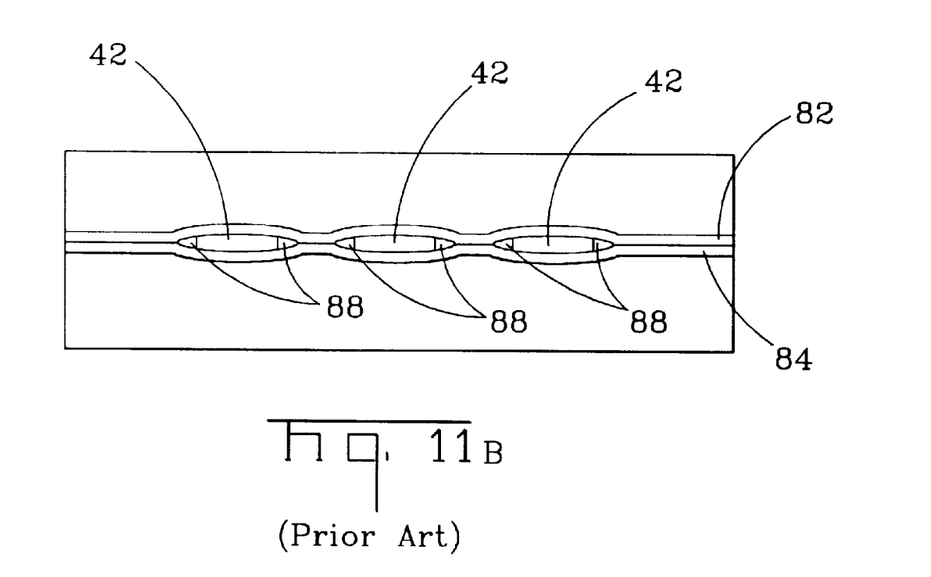

FIGS. 11a and 11b diagrammatically illustrate the difficulty encountered when sealing plate-like bus bars such as the ones used in the present invention. FIG. 11a shows an attempt to individually seal each bus bar 42 with an O-ring 80. Often, individual wires protrude from sealed housings and are individually sealed in this fashion. Discrete wires receive O-rings such as the O-rings 80 shown in FIG. 11a and a sealed interface is created between the individual wire and an opening in the sealed housing. As shown in FIG. 11a, such an arrangement would not reliably seal the distribution bus bars 42 because of their plate-like shape. O-rings 80 tend to seal only on two surfaces of bus bar 42, while openings 88 are created proximate the remaining two surfaces of the bus bar 42. This "eyeing" effect creates a passageway for fluids and other contaminants. FIG. 11b shows an "eyeing" effect produced by the use of two gaskets 82 and 84 placed above and below bus bars 42. In this configuration, openings 88 are created proximate each side edge of bus bar 42, again allowing for passage of fluids and other contaminants.

Under the teachings of the present invention, however, no "eyeing" effect is encountered since bottom and top gel pads 62a and 62b provide reliable sealing around bus bars 42. Furthermore, the sealed power distribution module of the present invention provides an economical sealing interface between the base housing and top housing by combining bottom and top gel pads 62a and 62b with a traditional O-ring type seal around the perimeter of power distribution panel 40. This hybrid type peripheral seal is more economical than a gasket prepared entirely from gel pad material since such a gasket must be die-cut from a solid sheet of gel pad material, thereby leading to large amounts of scrap gel pad material that must either be reclaimed or discarded. Furthermore, manipulation of O-ring type seals is much easier than handling gel pad type gaskets. Therefore, assembly of the power distribution module of the present invention is easier and less expensive.

The power distribution module and sealing arrangement of the present invention and many of its attendant advantages will be understood from the foregoing description. It is apparent that various changes may be made in the form, construction, and arrangement of parts thereof without departing from the spirit or scope of the invention, or sacrificing all of its material advantages. Thus, while embodiments of the invention have been disclosed, it is to be understood that the invention is not strictly limited to those embodiments but may be otherwise variously embodied and practiced within the scope of the appended claims.

I claim:

1. An environmentally sealed power distribution module, comprising:
    a power distribution panel with bus bars;
    a base housing and a top housing attachable to the base housing, wherein the power distribution panel is captured therebetween such that the bus bars project from the base housing and the top housing;
    an o-ring type seal disposed along a common perimeter between the base housing and the top housing; and
    a gel type seal disposed around the bus bars, wherein the o-ring type seal has an open segment between opposing free ends and wherein the gel type seal is disposed in the open segment and the opposing ends are placed within at least part of the gel type seal.

2. The power distribution module of claim 1, wherein the o-ring type seal and the gel type seal cooperate to complete a peripheral seal about the perimeter between the base housing and the top housing.

3. The power distribution module of claim 1, wherein the gel type seal is disposed on both the base housing and the top housing such that when the top housing is placed onto the base housing, the gel type seal sandwiches the bus bars.

4. The power distribution module of claim 3, wherein the base housing and the top housing have gel type seal receiving cavities which contain the gel type seal.

5. The power distribution module of claim 4, wherein the gel type seal receiving cavities are defined by opposed end walls and opposed side walls, wherein the end walls have slots to receive the free ends of the o-ring type seal.

6. The power distribution module of claim 5, wherein the side walls have recesses to provide passages for the bus bars.

7. The power distribution module of claim 1, wherein the top housing has an area of exposed electrical circuitry over which a cover is disposed.

8. The power distribution module of claim 7, wherein the cover is attached to the top housing by releasable clasps.

9. The power distribution module of claim 7, wherein a vent is disposed on one of the base housing, the top housing and the cover.

10. The power distribution module of claim 9, wherein the vent is a membrane which inhibits passage of fluids therethrough.

11. The power distribution module of claim 7, wherein a seal is provided between the cover and the top housing.

12. The power distribution module of claim 1, wherein the power distribution panel is a circuit board.

13. An environmentally sealed electronic module, comprising:
    a circuit board disposed between a base housing and a top housing, the base housing and the top housing defining an interface about a perimeter around the circuit board;
    bus bars extending from the circuit board and projecting through the interface;
    an o-ring type seal disposed within the interface; and
    a gel type seal disposed within the interface and around the bus bars, wherein the o-ring type seal has an open segment between opposed ends, and wherein the gel type seal is disposed in the open segment such that the opposed ends are placed within the gel type seal.

14. The sealed electronic module of claim 13, wherein fuses are mounted to the circuit board through the top housing and a sealed removable cover is disposed on the top housing over the fuses.

15. The sealed electronic module of claim 14, wherein the cover has a vent which inhibits ingress of liquids into the cover and allows gas to escape from the cover.

16. An environmentally sealed module, comprising:
    a base housing;
    a top housing attachable to the base housing at an interface;
    an electronic module disposed between the base housing and the top housing;
    an o-ring type seal disposed around the electronic module within the interface and having an open segment between free ends of the o-ring type seal;
    a gel type seal disposed within the interface in the open segment; and
    at least one terminal of the electronic module passing through the gel type seal.

17. The sealed module of claim 16, wherein the free ends of the o-ring type seal are disposed within the gel type seal.

18. The sealed module of claim 16, wherein the gel type seal comprises a top gel pad placed over the at least one terminal and a bottom gel pad placed under the at least one terminal.

19. A hybrid peripheral seal for sealing an interface, the seal comprising:
    an o-ring type seal having an open segment between two free ends; and
    a gel type seal disposed in the open segment.

20. The seal of claim 19, wherein the free ends are disposed within the gel type seal.

* * * * *